United States Patent [19]

Wilson et al.

[11] Patent Number: 4,699,084
[45] Date of Patent: Oct. 13, 1987

[54] APPARATUS FOR PRODUCING HIGH QUALITY EPITAXIALLY GROWN SEMICONDUCTORS

[75] Inventors: Herbert L. Wilson; William A. Guiterrez, both of Woodbridge, Va.

[73] Assignee: The United States of America as represented by the Secretary of the Army, Washington, D.C.

[21] Appl. No.: 452,673

[22] Filed: Dec. 23, 1982

[51] Int. Cl.[4] .......................... B05C 9/14; F27B 14/04
[52] U.S. Cl. .................................... 118/725; 156/611; 219/426; 427/252; 118/728
[58] Field of Search .................. 427/252; 156/611; 148/175; 118/726; 219/426; 117/725

[56] References Cited

U.S. PATENT DOCUMENTS

| | | | |
|---|---|---|---|
| 3,357,852 | 12/1967 | Ziegler | 148/175 UX |
| 3,406,242 | 10/1968 | Lang | 219/426 X |
| 3,494,743 | 2/1970 | Baughman et al. | 427/252 X |
| 3,749,383 | 7/1973 | Voigt et al. | 148/175 X |
| 3,984,267 | 10/1976 | Craford et al. | 427/252 X |
| 4,211,182 | 7/1980 | Rosnowski | 156/611 X |

Primary Examiner—Richard D. Lovering
Attorney, Agent, or Firm—Max L. Harwell; Milton W. Lee; Anthony T. Lane

[57] ABSTRACT

A high pressure furnace and reusable demountable containment means for selective in situ information of epitaxial layers on a semiconductor substrate while under gas overpressure. The containment means has vent means therein for allowing the inert and reducing or reactive gases in an inner chamber of the furnace to enter into the interior of the containment means to equalize pressures on each side of the housing and to semi-confine the vapor from the epitaxial growth source materials in the interior of the containment means. The containment means has a removable, i.e. demountable, form-fittedly sealed plug which is removed to insert the substrate and growth source elements, which are mounted in a close-space relationship on a support structure, therein. The support structure is inserted back into the containment means and the plug is form fittedly sealed thereto for performing the epitaxial layering.

16 Claims, 9 Drawing Figures

APPARATUS FOR PRODUCING HIGH QUALITY EPITAXIALLY GROWN SEMICONDUCTORS

The invention described herein may be manufactured, used, and licensed by the U.S. Government for governmental purposes without the payment of any royalties thereon.

BACKGROUND OF THE INVENTION

1. Field of the Invention

The present invention relates to special high pressure gas furnaces and reusable demountable ampules or tray assemblies used therein having removable plug for loading and unloading semiconductor substrates and epitaxial growth source materials in a closespace environment therein and vent means to allow equalizing high pressure across the enclosure housings and yet provide semi-confinement of source element vapors within the ampule or tray assembly.

2. Description of Prior Art

Prior art close-space epitaxial growth methods of high vapor pressure materials, such as Hg in HgTe growth source elements epitaxial layering on a CdTe substrate, have been done previously by first placing the substrates and elements in an evacuated ampule and then sealing the ampule for epitaxially growth. The ampule has to be broken after each growth for the source materials and substrate to be removed. In fact each and every growth step, including cleaning or degreasing steps, required evacuating and sealing a new ampule. There are many disadvantages to this system of using individually sealed ampules such as, there being no possibility of reuse of the ampule, the heated sealing causing release of ampule impurities into the epitaxy environment, or no ongoing control of the interior atmosphere of the ampule.

SUMMARY OF THE INVENTION

The present inventive apparatuses are comprised of selective furnaces and demountable semi-confinement ampules or multi-stacked tray assemblies containment means for placement in an inner chamber of the furnace wherein the containment means have pressure equalizing vent means. A semiconductor substrate and some growth source materials are placed in a closed-space epitaxial growth environment within the ampule or tray assembly to provide an improved means for epitaxial layering, also called the isothermal-evaporation-condensation-diffusion technique. The high pressure furnace may be either of the internally or of the externally heated type, i.e. the heater elements either located inside the gas pressurized environment or outside the pressurized environment, and have gas feed line means for pressurizing or purging the inner chamber where the ampule or tray assembly is located. The furnaces may be positioned with the elongated inner chamber in the vertical or horizontal. The externally heated furnace may also be conveniently movable to surround the ampule or tray assembly during heat up and moved away during cool down time.

Reaction of the elements in the inner pressurized chamber to any volatile reactive high pressure gases must be minimized. The inner chamber walls and fixtures are therefore made of high purity materials with a high chemical inertness to the materials and which resist reaction alloying, deterioration, or contamination with reactive gases or vapors of the epitaxial process. Such materials that may be used for the inner furnace chamber walls are ceramics, e.g. alumina. The furnace preferably has a steel pressure jacket outward from the inner ceramic wall to withstand the extremely high pressures of the pressure shell of the internally heated furnace. All of the elements inside the heated pressurized chamber are preferably made of high purity materials with a high chemical inertness to the materials involved in the epitaxy growth, such as quartz. Quartz resists reaction with volatile materials, such as HgCdTe or gases caused by or used with the high temperature high pressure epitaxial process.

The demountable ampule and multi-stacked epitaxial tray assembly may be repeatedly used in the epitaxial growth process and, after repeated reactive gas scrubbing of the ampule and tray assembly, the contamination originally present in the earlier growths are reduced. The ampule and tray assemblies are comprised of a housing with a removable end plug for loading semiconductor substrates and epitaxial growth source materials therein and vent means providing a semi-confinement atmosphere for the epitaxial vapors during epitaxial layering. The vent means also provides pressure equalization of the interior with the exterior environments. The ampule end plug may have the vent means therein in the form of a groove running its entire length, may be a very small hole in the ampule housing, may have a vent in a guide tube that a guide rod passes through to move a slide bar that the substrate is positioned on, or there may be other vent means to provide pressure equalization and the semiconfinement environment. The multi-stacked tray assembly also has vent means in end plugs and around the source and substrate support trays. There are no particular limits to the size of the inner chamber or the ampules or assemblies.

It should be noted that the pressures from the inner chamber through the vent means really provide an overpressure, i.e. over and above the pressures caused by the heated epitaxial growth source vapors. Further, the degree of confinement has an epitaxial layer in which the greater the confinement, either by the gas overpressures or by the physical enclosures, produces shorter cut-off wavelength in the transmission spectral response.

Some selected high pressure furnaces are capable of pressures up to and above 10,000 psi and temperatures of 750° C. or more. The furnaces are then modified to have the inner elements that are in contact with the epitaxial growth be made of the above mentioned chemically inert materials. The epitaxial growth process made possible by those furnaces and ampules or tray assemblies is now disclosed in a separate patent application Ser. No. 426,475 by the present coinventors, entitled "Close-Space Epitaxy Process", and filed on Sept. 29, 1982.

For a better understanding of the invention refer to the following drawings referenced in the detail description.

DETAILED DESCRIPTION OF THE EMBODIMENTS

Figure 1:
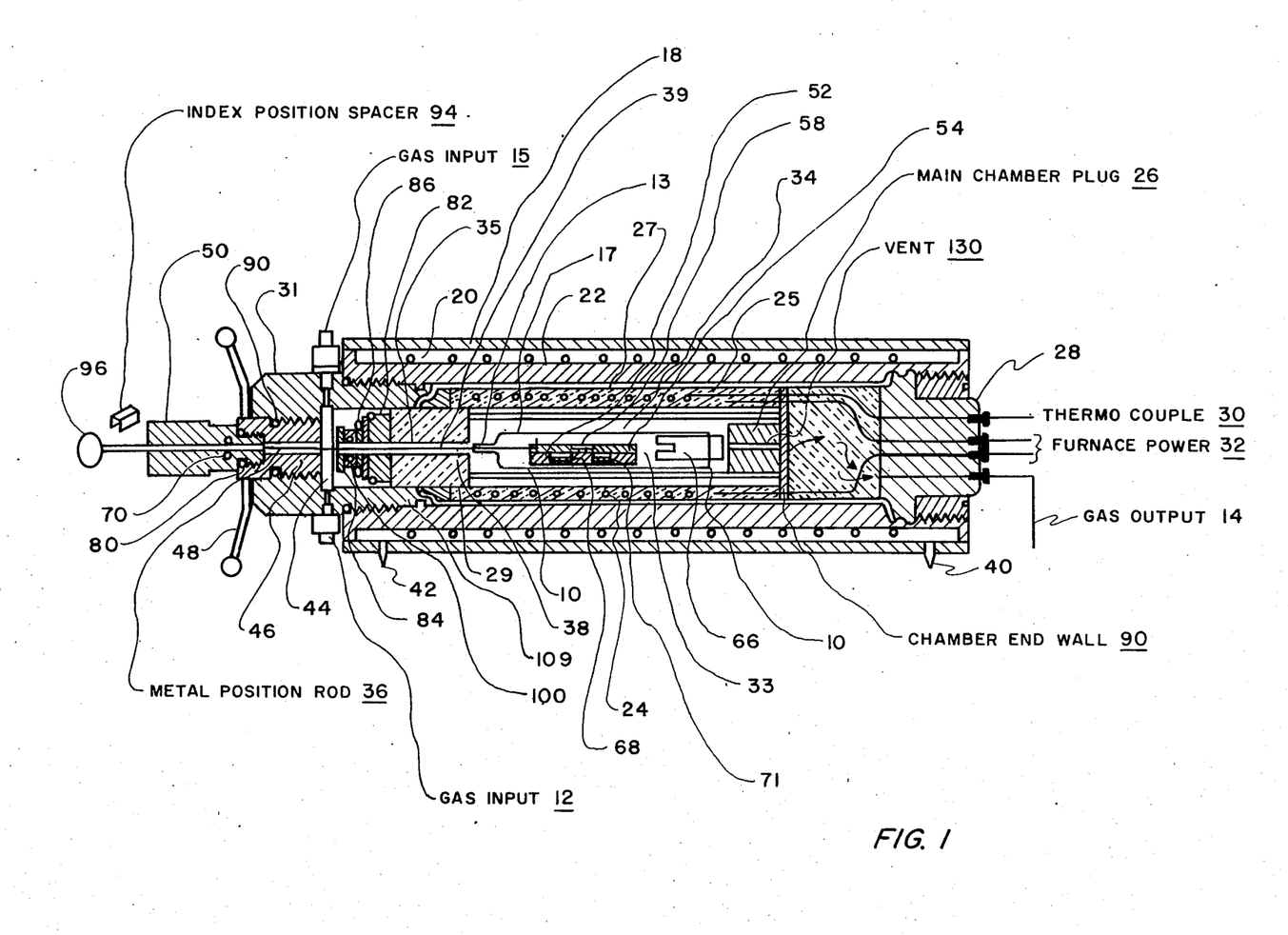
FIG. 1 illustrates a cross-sectional view of a typical internally heated furnace of the invention showing a multiple source ampule loaded therein.

Refer first to FIG. 1 which illustrates a typical internally heated furnace having an inner chamber 34 enclosed by a main chamber housing 27. The inner chamber is shown with a reusable demountable containment means, in this case a multiple growth source materials ampule 10 having an epitaxial growth chamber 33 enclosed by growth chamber housing 17 which is loaded with multiple growth sources, represented by 68 and 70, in the wells of a support structure 52 and covered by a slide bar 54 positioning means for positioning substrate 58 over the growth sources. Housing 17 is enclosed by demountable end plug 66. Slide bar 54 has a position rod 39 attached thereto that feeds out a guide tube 13 through a guide channel 38, which is surrounded by a solid quartz plug 29, and is connected to a metal position rod 36, preferably made of steel, by a twist lock connection means for easy attachment and disattachment. Rod 36 passes on through a gas seal assembly 82 and end cap 46 having handles 48 thereon to a spring loaded mechanical feedthrough 50 having an end knob 96 attached to rod 36. A plurality of index position spacers 94 are selectively positioned between knob 96 and the housing of 50 to selectively position the substrate either over the growth soures or in the shuttered position, as shown. The gas seal assembly 82 is comprised of a gas seal cap 84 preferably made of stainless steel, which is screw threadably connected through steel closure to the quartz plug 29 and a plurality of screws 86 that hold cap 84 to assembliy 82. Quartz plug 29 is sealed to assembly 82, preferably by a Teflon ring. Various O-rings, generally made of rubber, provide the proper seals at the gas input end of the furnace. Gas inputs 12 and 15, perhaps representing respectively one input for inert and reducing gas mixtures and another input from reactive gas mixtures, feed directly into a gas reservoir 44. Gas reservoir 44 is surrounded by stationary closure 31, end cap 46, and gas seal assembly 82. O-ring 70 fits snugly around position rod 36. O-rings 80 and 90 seal the areas respectively between mechanical feedthrough 50 and end plug 46 and between end plug 46 and closure 31 when 50 and 46 are screw threadably connected to the furnace. O-rings 100 and 109 respectively seal the interior of gas seal cap 84 against the guide channel 38 and the area between the gas seal assembly 82 and the inner wall of the furnace when gas seal cap 84 is screw threadably connected into assembly 82. The vent means in this embodiment is through seal assembly 82, guide channel 38, and guide tube 13 which is along the same path that rods 36 and 39 travel. Typical structure of the internally heated furnace if further explained with reference to FIG. 1. The structure is explained beginning outward from the chemical inert materials items, i.e. preferably quartz materials, comprised of the main chamber housing 27 and end plug 26 having a gas vent 130 therein, the growth chamber housing 17 and all supporting structure therein including rod 39, guide channel 38, and solid quartz plug 29. A ceramic tube, made of a relatively chemically inert high temperature conductivity material, such as alumina, is preferably the innermost layer of material. A ceramic such as alumina is also resistant to reactions with vapors of corrosive materials, such as HgCdTe or others, used in the epitaxial layering process. Next the heater elements 24, powered by furnace power leads 32 from a power source (not shown) and whose temperature is monitored by thermocouple from lead 30, are embedded in loosely fitting insulation 25, such as foam silica. Insulation 25 is surrounded by metal chamber wall 22, a water jacket 20 fed by water inlets and outlets 40 and 42 having baffles therein, and a safety metal jacket 18 on the outside. High pressure gases from the interior of the furnace slowly filters through the loose fitting chamber end wall 90 and insulation and out through gas output line 14 which runs through head closure 28.

Figure 2:
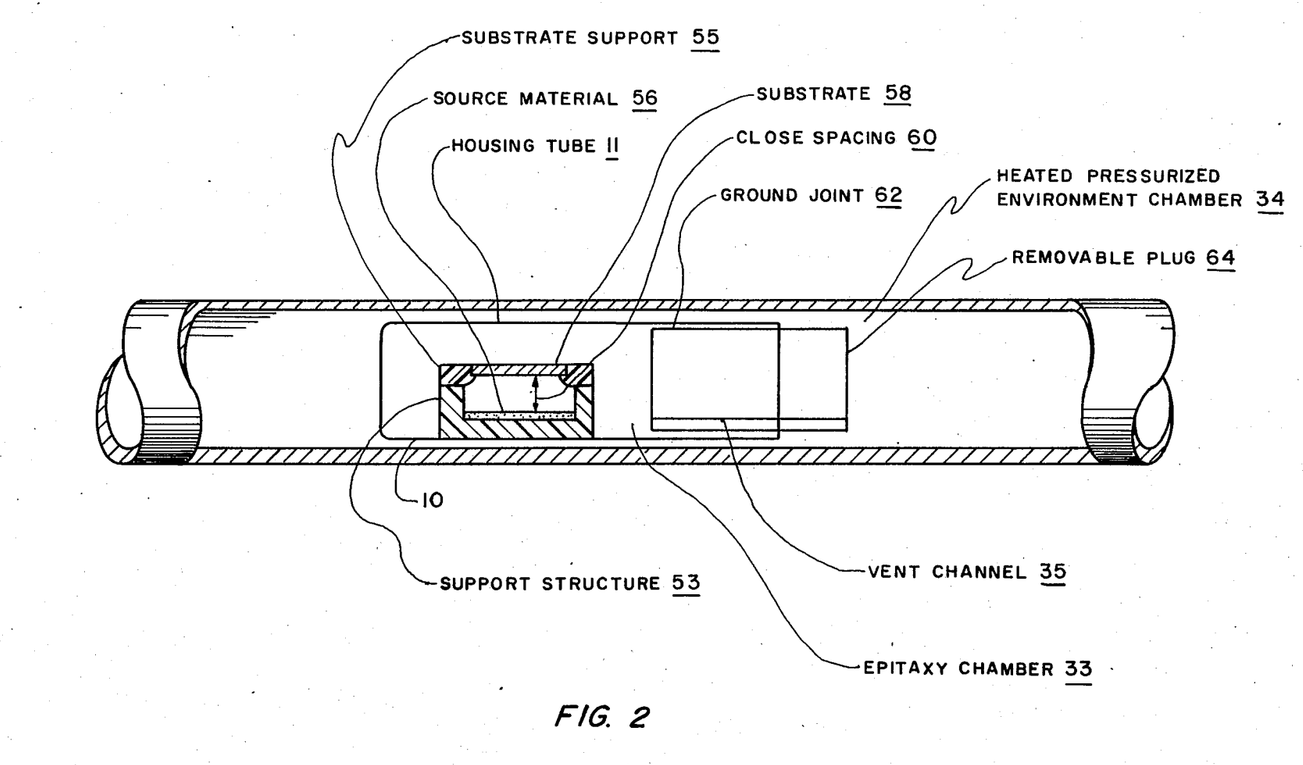
FIG. 2 shows a partial cross-sectional view of a typical single source ampule.

FIG. 2 illustrates another ampule 10 type reusable demountable containment means in which only one growth source 56 is shown whereby a positioning rod is not needed. The ampule housing 11 has the removable end plug 64 with a vent channel 35 form-fittedly sealed thereto by a ground joint 62 to semiconfine the epitaxy chamber 33 within chamber 34. Substrate 58 is positioned on support 55 wherein support 55 rides on the source material support structure 53 to position substrate 58 in close spacing 60 from a source material 56, wherein spacing 60 is about 5 millimeters.

Figure 3:
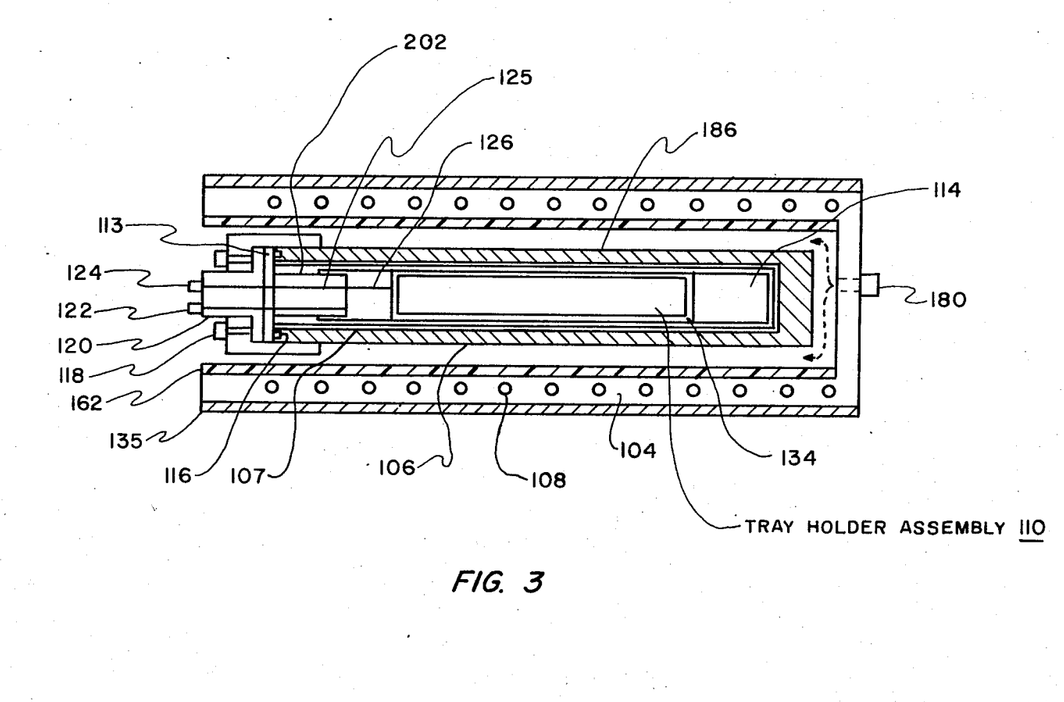
FIG. 3 illustrates a partial cross-sectional view of a typical externally heated furnace with an epitaxial tray assembly shown therein.
Figure 4:
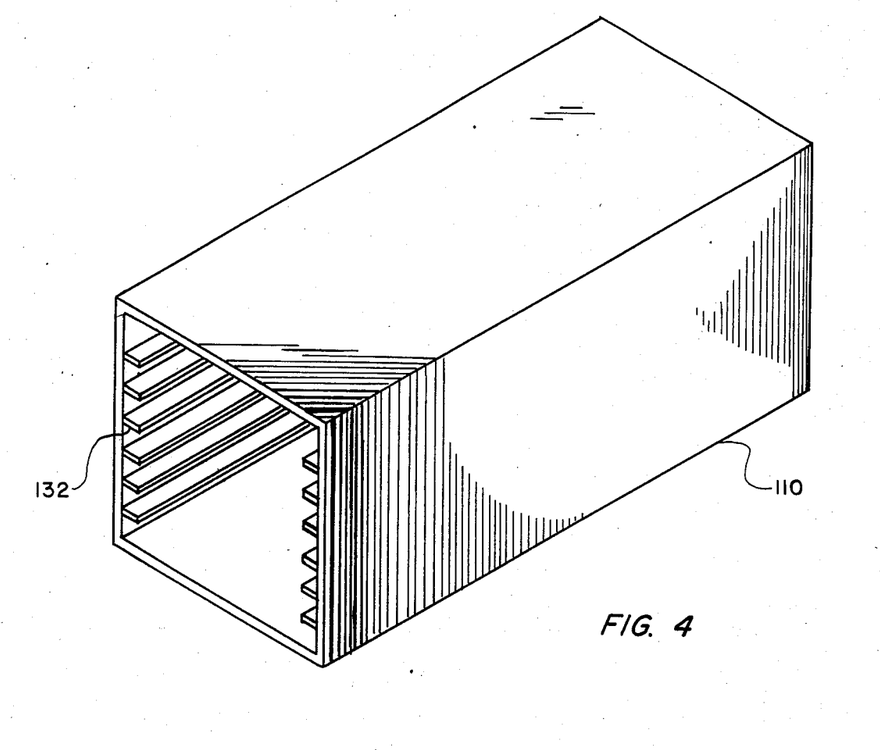
FIG. 4 shows schematically an epitaxial tray holder for horizontal mounting in a furnace.
Figure 5:
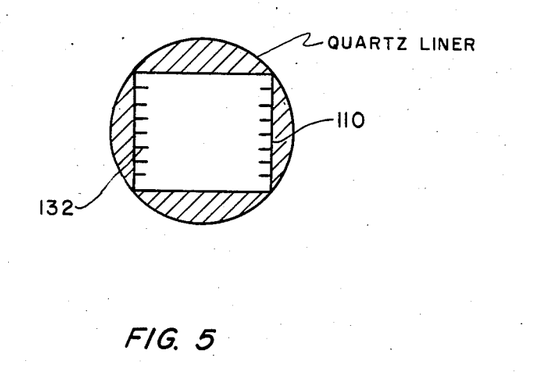
FIG. 5 is an end view of the tray holder looking into the inner chamber.

FIG. 3 illustrates a typical externally heated furnace in which the reusable demountable containment means in shown as an epitaxial multi-stacked tray assembly, which is discussed more specifically with reference to FIGS. 4 through 8. It should be noted that either the ampule confinement means or the tray assembly confinement means may be used in either the internally heated or the externally heated furnaces. It is however probably more feasible to use the multi-stacked tray assembly for mass production in the externally heated furnace since the heated volume can generally be made larger in the externally heated furnace. Therefore, the multi-stacked tray assembly will be discussed with reference to the externally heated furnace. It should also be noted that the externally heated furnace may especially be adapted to swivel to stand upright or be in the horizontal position. FIGS. 4 and 5 especially illustrate the tray holder 110 having tray supports 132 therein as in the elongated rectangular position commensurate with the furnace in the horizontal position. However, if the furnace is positioned upright in the vertical position, tray holder 110 of the containment means is obviously preferably square and with both ends sealed and a loose stackable means for the trays from the top versus the sides. The trays may conveniently be circular rather than square in the vertically positioned furnace.

Figure 6:
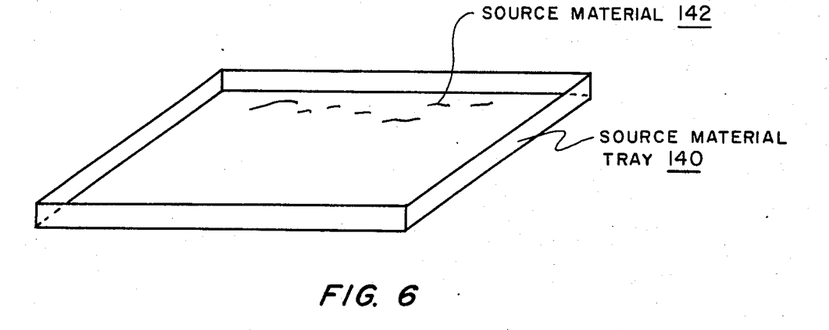
FIG. 6 shows an open source material tray for mounting in the holder.
Figure 7:
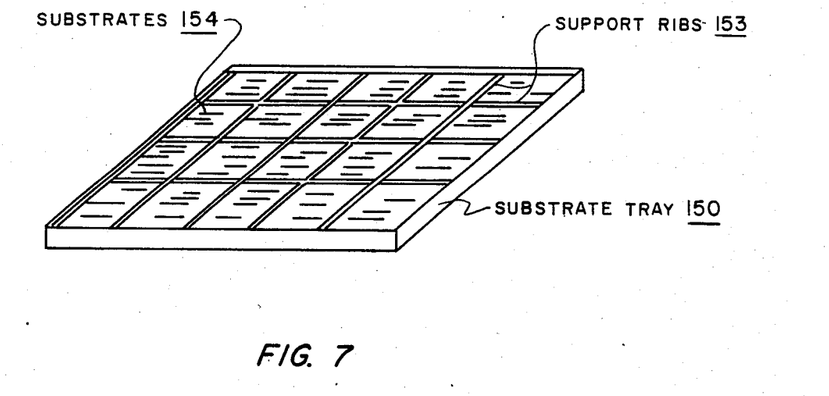
FIG. 7 shows a substrate tray for alternately mounting with the source tray in close-space proximity therewith.
Figure 8:
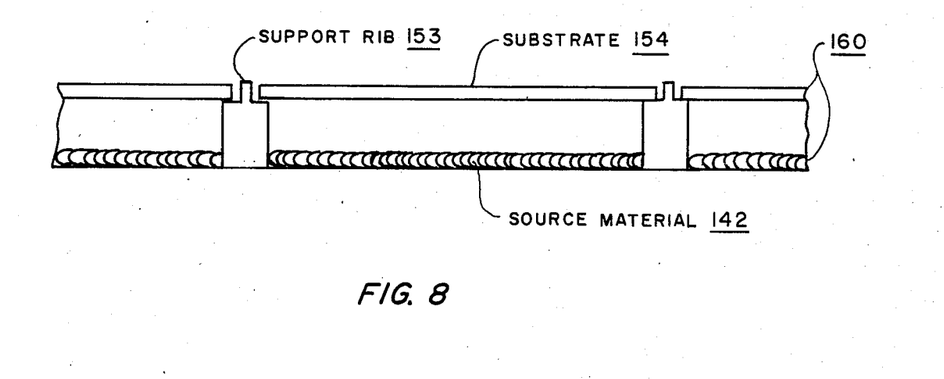
FIG. 8 shows an integral source and substrate tray with raised support ribs to maintain the close-space environment.

The stackable trays may be as separate alternately positioned trays 140 for the source material 142 and substrate trays 150 having support ribs 153 for the substrates 154 thereon as shown respectively in FIGS. 6 and 7. Alternately, as shown by FIG. 8 monolithic trays 160 having both the source materials 142 therein and the substrates 154 supported by raised support ribs 153 mounted in the same tray may be used. Both types of mountings have the source materials and the substrates in a close-space proximity of preferably about 5 millimeters distance apart.

Return now to FIGS. 3 and 9 wherein different uses of the same type externally heated furnace are illustrated. FIG. 3 illustrates a stationary type horizontally positioned furnace with the tray assembly 110 placed in the internal chamber 134 with plug 114 at one end thereof and sealed by an end cap 202, head gasket 116, thrust washer 113, and a hed assembly 120 secured by thrust bolts 118. Port 124 represents the vacuum and gas feed lines feeding through a vent means 125 in cap 202 and vent means 126 of an input plug into the internal chamber 134. Port 122 is representative of the connecting internal thermocouple to the inner chamber of the furnace. The outer heating housing of the externally heated furnace going from outside to inside is comprised of an outer metal shell 135 a heating jacket 104 having the heating elements 108 therein embedded in insulation, and the inner layer of steel tubing 162. In FIG. 3, where the furnace is stationary, forced cooling air at inlet 180 is circulated around the interior of the outer housing and around an inner high pressure reaction vessel 186, herein referred to as a high pressure bomb. The high pressure bomb is comprised of a main outer high pressure wall 106, preferably made of steel, and the inner quartz tube wall 107 contiguous with the inner chamber of the furnace. An input plug has a vent channel 126 in cooperation with vent 125 in cap 202 through which the inert, reducing, and reactive gases selectively pass into the epitaxial growth area where the tray holder assembly 110 is located.

Figure 9:
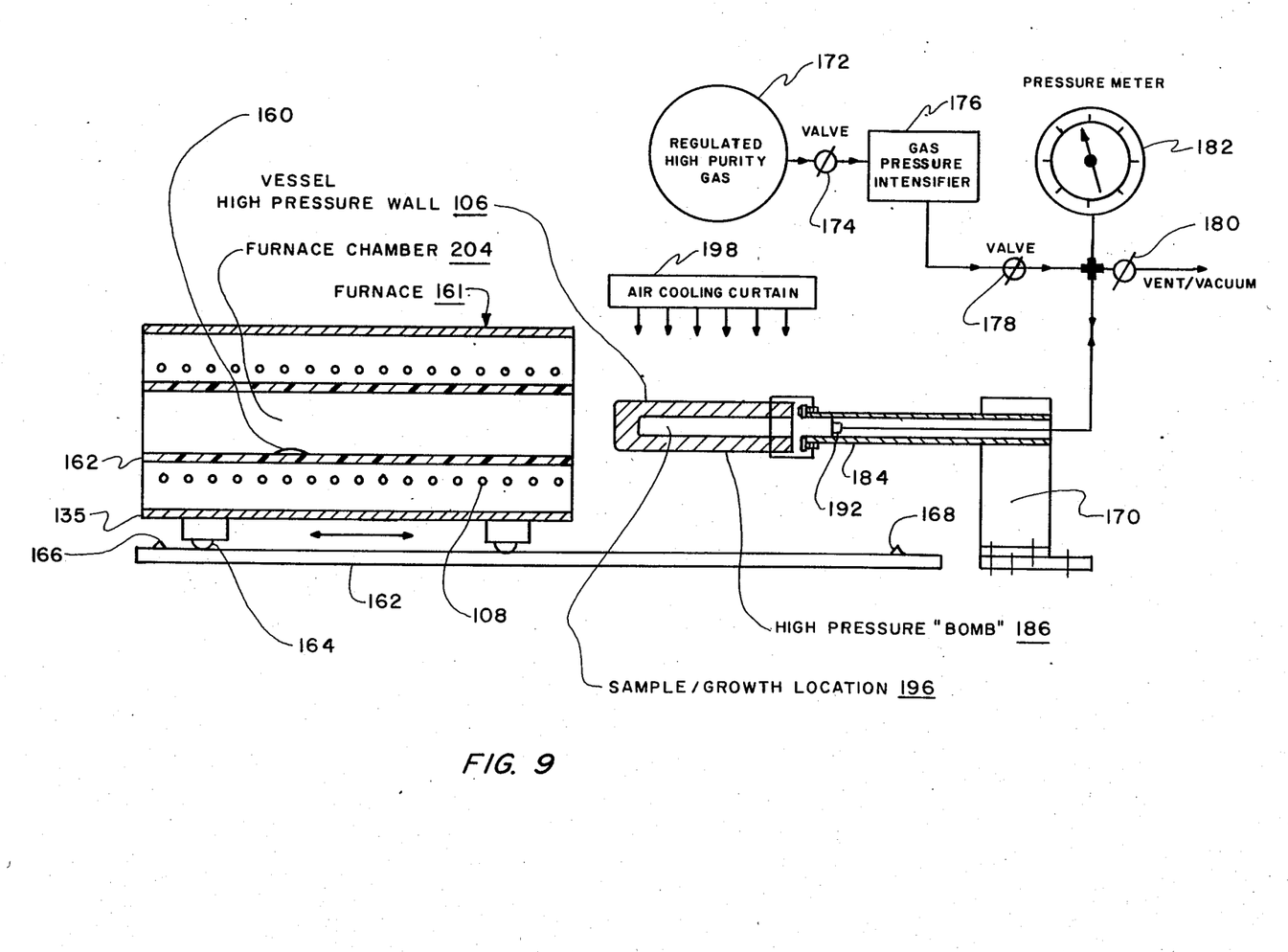
FIG. 9 illustrates an externally heated furnace that is selectively moved around or away from the close-space epitaxial growth high pressure bomb.

FIG. 9 illustrates an environment in which the external furnace portion 161 which has the same numeral references to 108, 135, and 162 as noted above for FIG. 3 is mounted on wheels 164 to travel on a track means 162 having stops 166 and 168 to limit the travel thereof. During the epitaxial growth process the preheated furnace chamber 204 of the moveable furnace 161 is moved to surround the sealed high pressure bomb 186. The high pressure bomb 186 is supported by cantilevered support structure 170 having a support sleeve 184, preferably made of ceramic, and is compensated for any sag by a furnace centering spring 160 inside the externally heated moveable furnace portion 161. During the epitaxial growth process, high purity gas is supplied by a gas feedthrough 192 into the sample growth location 196 of the bomb 186. The high pressure gas is supplied from a regulated high pressure gas bottle 172 through valve 174 to a gas pressure intensifier 176 and is then valved by valve 178 to gas feedthrough 192 and simultaneously to vent/vacuum valve 180 and pressure meter 182. After the epitaxial growth process, furnace 161 may be rolled away from bomb 186 to facilitate rapid cooling of the epitaxial growth high pressure bomb 186. An air cooling curtain 198 may then pass cooling air over the high pressure bomb 186 to cool the bomb even faster.

While the invention has been illustrated and described by means of specific embodiments, it is to be understood that changes and modifications may be made therein without departing from the spirit and scope of the invention as defined by the appended claims.

We claim:

1. An apparatus for close-space epitaxial layering in a gas overpressure environment comprising:
   a high temperature high pressure furnace having an inner chamber made of ceramic material surrounded by insulation material and high pressure resistant metal which are resistant to reaction with materials and gases used in epitaxial layering process;
   gas flow and pressure control gas feed line means for allowing selective high pressure inert and reducing gases and/or reactive gases to flow therethrough for pressurizing and purging said inner chamber throughout the entire epitaxial process; and
   a reusable demountable containment means having pressure equalizing vent means in which epitaxial layering processes can be repeatedly performed in a semi-confinement high temperature high gas overpressure environment within said containment means wherein said containment means has a substrate and growth source material therein in close-space area and containment means is positioned within said inner chamber of said furnace during said epitaxial layering process wherein said selective gases are supplied to the interior of said containment means through said pressure equalizing vent means to confine said growth source material flow to said close-space area.

2. An apparatus as set forth in claim 1 wherein said ceramic material is an inner wall of alumina.

3. An apparatus as set forth in claim 2 wherein said reusable demountable containment means is made of a high purity material with a high chemical inertness to the materials and vapors of said epitaxial layering process.

4. An apparatus as set forth in claim 3 wherein said reusable demountable containment means is specifically made of quartz and has demountable form-fittedly sealed end plugs for loading and unloading substrates and epitaxial growth source materials and their support structures therethrough.

5. An apparatus as set forth in claim 4 wherein said support structures separate said substrates and said epitaxial growth source materials by a close-space of about 5 millimeters.

6. An apparatus as set forth in claim 5 wherein said high temperature high pressure furnace is an internally heated furnace with the heater elements inside the pressurized environment of said inner chamber.

7. An apparatus as set forth in claim 6 wherein said reusable demountable containment means is comprised of a non-fused ampule in which said form-fittedly end plug maybe removed to load said epitaxial growth source material contained in walls of a support structure and a substrate on a substrate support loosely positioned over said support structure and said end plug is reattached to said ampule.

8. An apparatus as set forth in claim 7 wherein said substrate support is a slide bar which has a mechanical connection thereto leading to a mechanical feedthrough on the outside of said furnace and there are a plurality of said wells containing growth source alloy materials in said support structure whereby said mechanical feed through is used to selectively move said substrate over said plurality of wells during said epitaxialy layering process.

9. An aparatus as set forth in claim 6 wherein said reusable demountable containment means is comprised of an epitaxial multi-stacked tray assembly in which said form-fittedly end plug is removed to load a plurality of loosely stacked trays therein which alternately hold said growth source materials and said substrates therein and said end plug is reattached to said assembly.

10. An apparatus as set forth in claim 6 wherein said furnace is positioned with said inner chamber in the horizontally elongated position.

11. An apparatus as set forth in claim 5 wherein said high temperature high pressure furnace is an externally heated furnace with heater elements outside the pressurized environment of said inner chamber.

12. An apparatus as set forth in claim 11 wherein said reusable demountable containment means is comprised of a non-fused ampule in which said form-fittedly end plug is removed to load said epitaxial growth source material contained in walls of a support structure and a substrate on a substrate support loosely positioned over said support structure and said end plug is reattached to said ampule.

13. An apparatus as set forth in claim 11 wherein said reusable demountable containment means is comprised of an epitaxial multi-stacked tray assembly in which said form-fittedly end plug is removed to load a plurality of loosely stacked trays therein which alternately hold said growth source materials and said substrates therein and said end plug is reattached to said assembly.

14. An apparatus as set forth in claim 11 wherein said furnace is positioned with said inner chamber in the horizontally elongated position.

15. An apparatus as set forth in claim 11 wherein said reusable demountable containment means and said preheated furnace are moveable with respect to each other wherein said containment means is supported by a support structure and said furnace is moved along a track guide means to completely enclose said containment means during the heat up and epitaxial layering time and is removed therefrom during cool down time.

16. An apparatus as set forth in claim 1 wherein said high temperature high pressure furnace may be heated to a temperature of more than 750° Celsius at a gas pressure of more than 10,000 pounds per square inch.

* * * * *